(12) United States Patent
Foncellino

(10) Patent No.: US 11,906,416 B2
(45) Date of Patent: Feb. 20, 2024

(54) MEMS MICROPARTICLE SENSOR

(71) Applicant: STMICROELECTRONICS S.R.L., Agrate Brianza (IT)

(72) Inventor: Francesco Foncellino, Casagiove (IT)

(73) Assignee: STMICROELECTRONICS S.r.l., Agrate Brianza (IT)

(*) Notice: Subject to any disclaimer, the term of this patent is extended or adjusted under 35 U.S.C. 154(b) by 226 days.

(21) Appl. No.: 17/563,644

(22) Filed: Dec. 28, 2021

(65) Prior Publication Data
US 2022/0205898 A1 Jun. 30, 2022

(30) Foreign Application Priority Data
Dec. 29, 2020 (IT) .................. 102020000032660

(51) Int. Cl.
*G01N 15/06* (2006.01)
*B81B 3/00* (2006.01)
(Continued)

(52) U.S. Cl.
CPC ....... *G01N 15/0643* (2013.01); *B81B 3/0005* (2013.01); *G01N 1/2205* (2013.01);
(Continued)

(58) Field of Classification Search
CPC .............. G01N 1/2205; G01N 15/0643; B81B 2201/0214; B81B 2203/0127; B81B 2203/019
See application file for complete search history.

(56) References Cited

U.S. PATENT DOCUMENTS

| 7,294,536 B2 | 11/2007 | Villa et al. |
| 2008/0261345 A1 | 10/2008 | Villa et al. |

(Continued)

FOREIGN PATENT DOCUMENTS

| CN | 106153718 A | 11/2016 |
| DE | 102016009635 A1 * | 8/2017 |
| WO | WO 0148453 A2 | 7/2001 |

OTHER PUBLICATIONS

Bao et al., "A resonant cantilever based particle sensor with particle-size selection function," J Micromech. Microeng., 28 (8) 085019:1-11, May 16, 2018. (Year: 2018).*

(Continued)

*Primary Examiner* — Nathaniel J Kolb
(74) *Attorney, Agent, or Firm* — Seed IP Law Group LLP

(57) ABSTRACT

A MEMS sensing device for sensing microparticles in an environment external to the MEMS sensing device is provided. The MEMS sensing device comprises a semiconductor body integrating a sensor and a pump unit, the sensor including a sensor cavity, a membrane suspended over the sensor cavity, and a piezoelectric element over the membrane and configured to cause the membrane to oscillate, about an equilibrium position, at a corresponding resonance frequency when sensing electric signals are applied to the piezoelectric element during a first operative phase of the MEMS sensing device, the resonance frequency depending on an amount of microparticles located on the membrane, the membrane having a plurality of through holes for establishing a fluid communication between the sensor cavity and the environment; the pump is configured to cause air pressure in the sensor cavity to be reduced with respect to the air pressure of the environment during the first operative phase, so that microparticles are caused to adhere onto the (Continued)

membrane by a suction force through the plurality of through holes.

21 Claims, 10 Drawing Sheets

(51) Int. Cl.
    *G01N 15/10*    (2006.01)
    *G01N 1/22*    (2006.01)
    *G01N 15/00*    (2006.01)

(52) U.S. Cl.
    CPC ..... *G01N 15/0618* (2013.01); *G01N 15/1056* (2013.01); *B81B 2201/0214* (2013.01); *B81B 2203/019* (2013.01); *B81B 2203/0127* (2013.01); *G01N 2015/0046* (2013.01)

(56) References Cited

U.S. PATENT DOCUMENTS

| | | | |
|---|---|---|---|
| 2017/0246662 | A1 | 8/2017 | Kidwell, Jr. et al. |
| 2018/0178251 | A1 | 6/2018 | Foncellino et al. |
| 2019/0063421 | A1* | 2/2019 | Mou ................. G01N 33/0009 |
| 2019/0372554 | A1 | 12/2019 | Lee et al. |
| 2020/0309665 | A1* | 10/2020 | Schneider ............ G01N 29/036 |

OTHER PUBLICATIONS

4 Maldonado-Garcia et al., "Chip-Scale Implementation and Cascade Assembly of Particulate Matter Collectors with Embedded Resonant Mass Balances," IEEE Sensors Journal, 17(6):1617-1625, Mar. 15, 2017. (Year: 2017).*

Machine translation of DE-102016009635-A1 (Year: 2017).*

Lu et al., "Modeling, Fabrication, and Characterization of Piezoelectric Micromachined Ultrasonic Transducer Arrays Based on Cavity SOI Wafers," *Journal of Microelectromechanical Systems* 24(4): 1142-1149, Aug. 2015.

Muramatsu et al., "Basic characteristics of quartz crystal sensor with interdigitated electrodes," *Analytical Chemistry Research* 7: 23-30, Feb. 2016.

Yang et al., "An Ultra-High Element Density pMUT Array with Low Crosstalk for 3-D Medical Imaging," *Sensors* 13: 9624-9634, Jul. 2013.

Bao et al., "A resonant cantilever based particle sensor with particle-size selection function," *J. Micromech. Microeng.*, 28 (8) 085019:1-11, May 16, 2018.

Carminati et al., "Emerging Miniaturized Technologies for Airborne Particulate Matter Pervasive Monitoring," *5th IMEKO TC19 Symposium, International Measurement Confederation*, Naples, Italy, Oct. 5-7, 2020, pp. 76-80.

Djoumi et al., "Real Time Cascade Impactor Based on Surface Acoustic Wave Delay Lines for PM10 and PM2.5 Mass Concentration Measurement," *Sensors*, 18(255):1-11, Jan. 16, 2018.

Maldonado-Garcia et al., "Chip-Scale Implementation and Cascade Assembly of Particulate Matter Collectors with Embedded Resonant Mass Balances," *IEEE Sensors Journal*, 17(6):1617-1625, Mar. 15, 2017.

Olsson, "Valve-less Diffuser Micropumps," Thesis, Doctor of Philosophy, Royal Institute of Technology, School of Electrical Engineering, Stokholm, 1998. (66 pages).

Schmid et al., "Real-time single airborne nanoparticle detection with nanomechanical resonant filter-fiber," *Scientific Reports* 3(1288):1-5, Feb. 15, 2013.

* cited by examiner

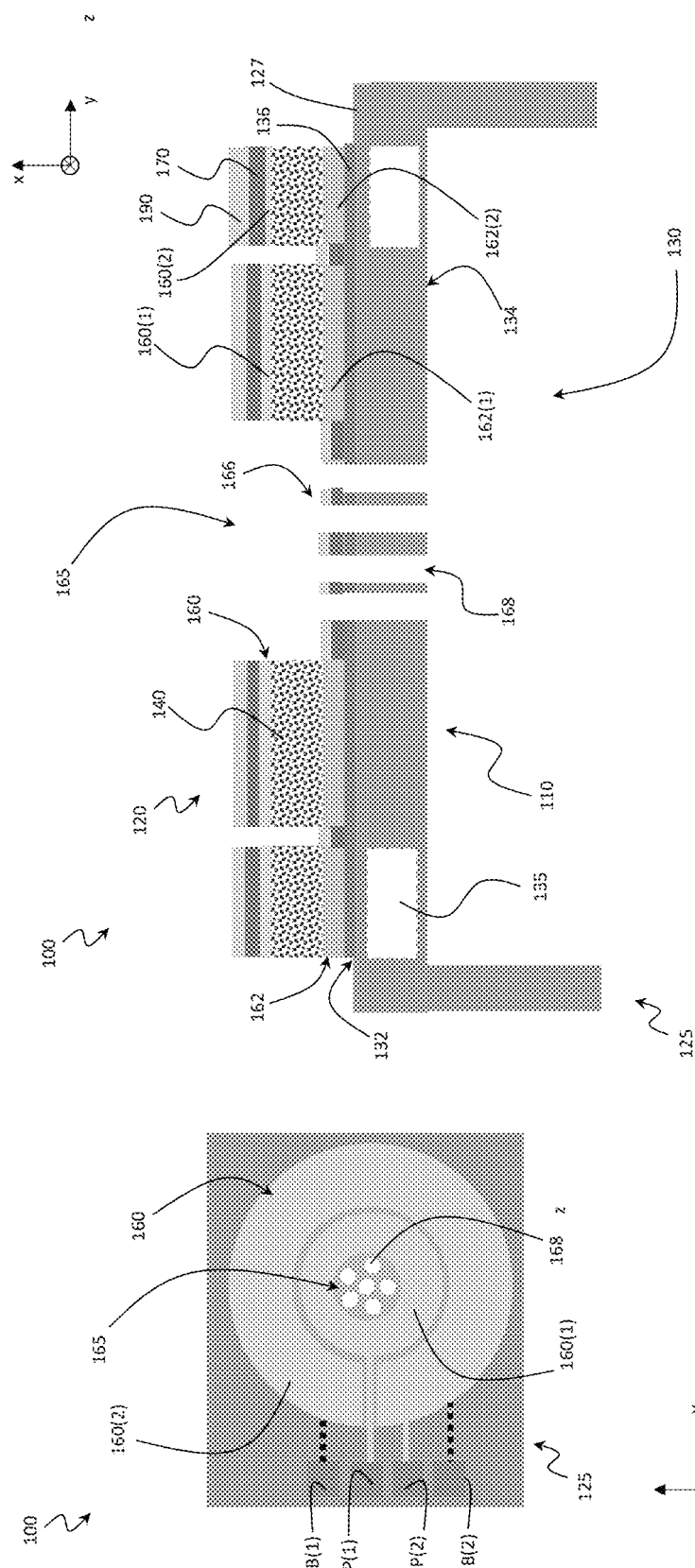

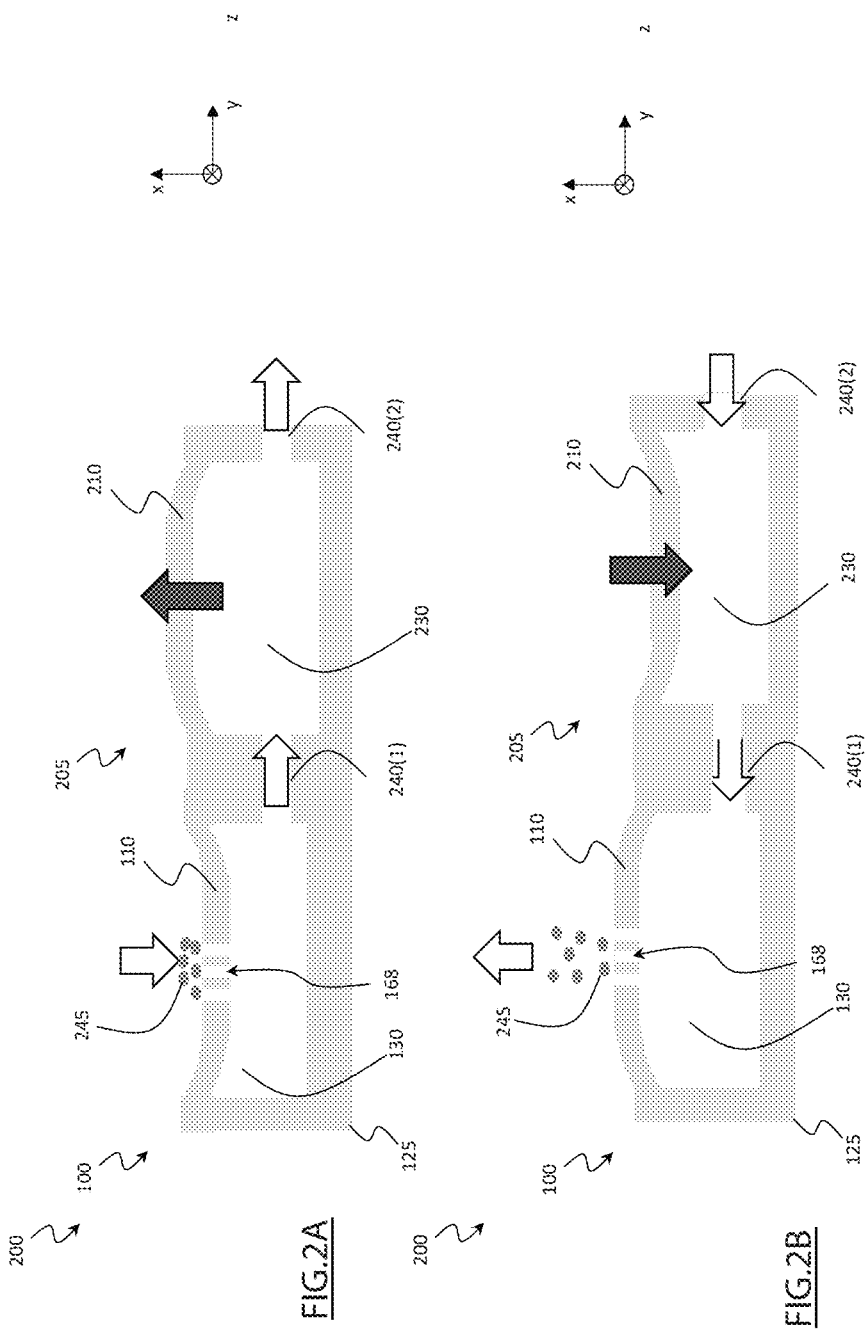

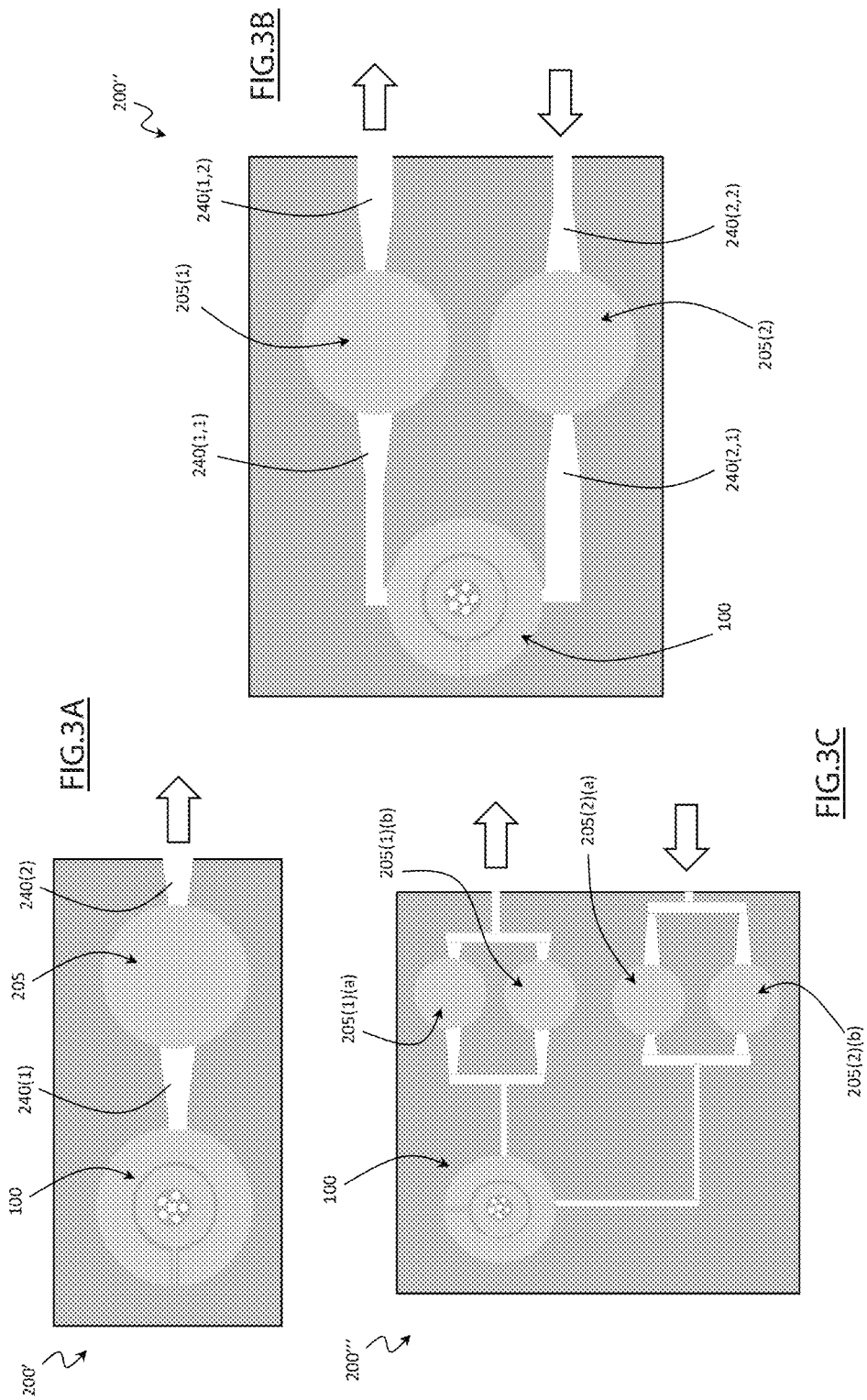

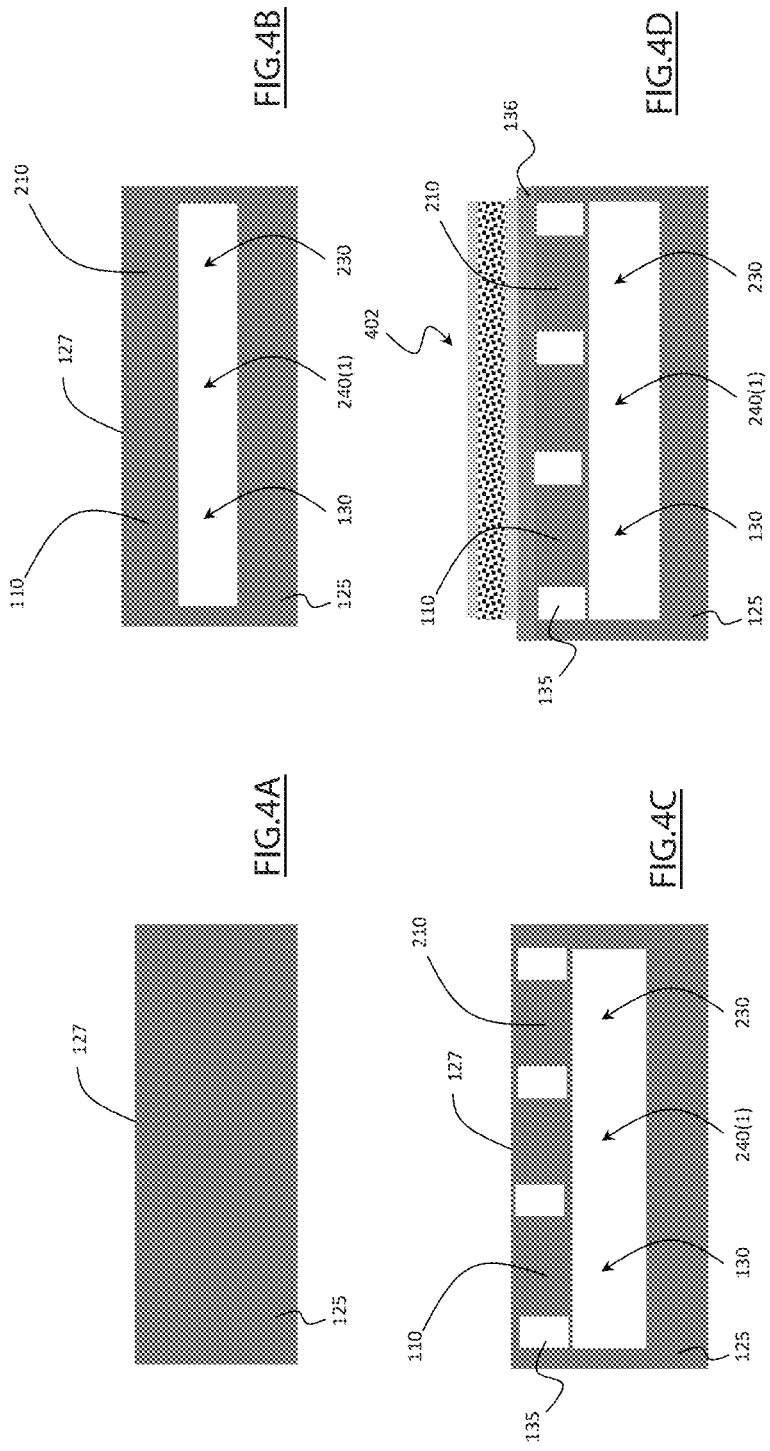

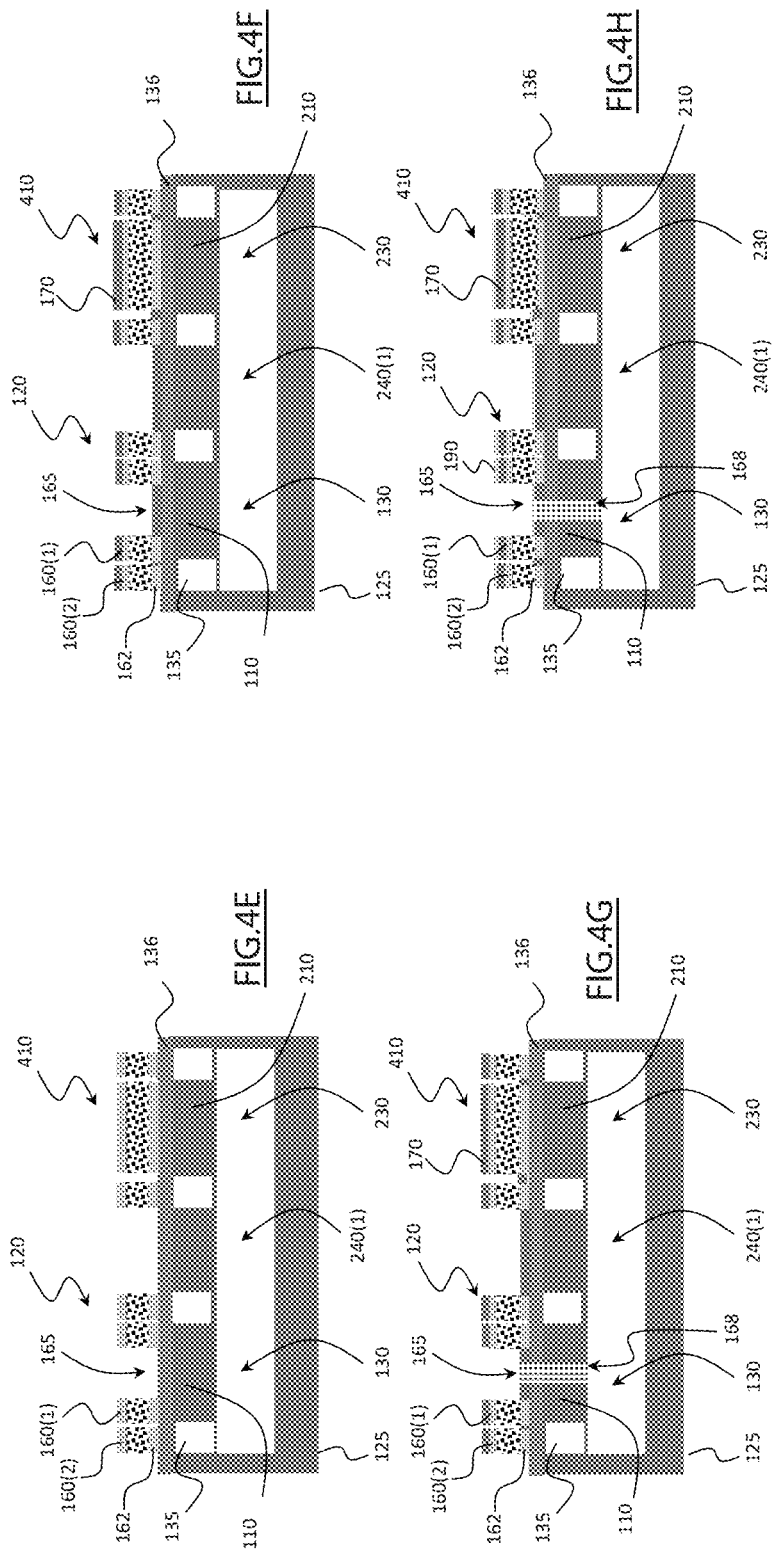

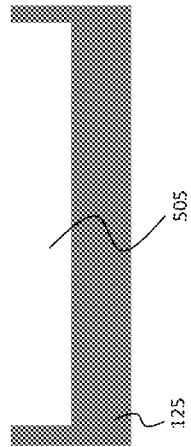
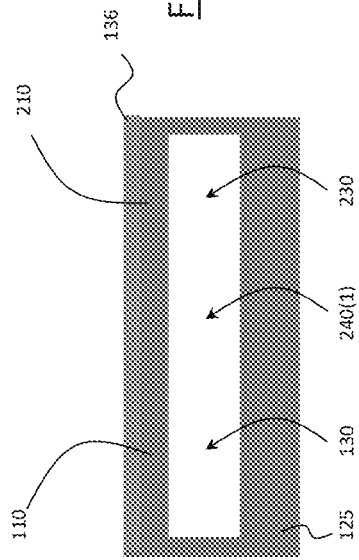
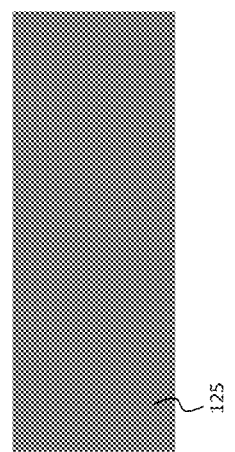
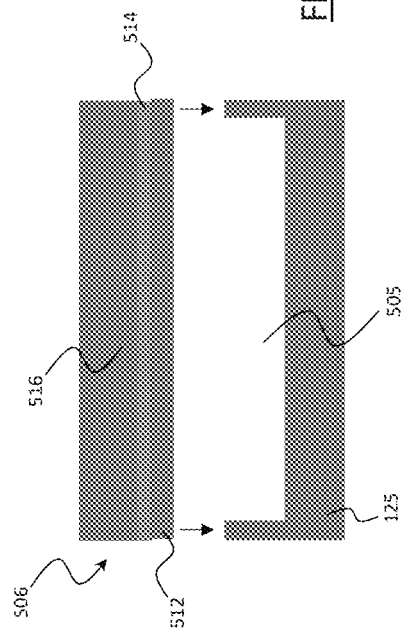

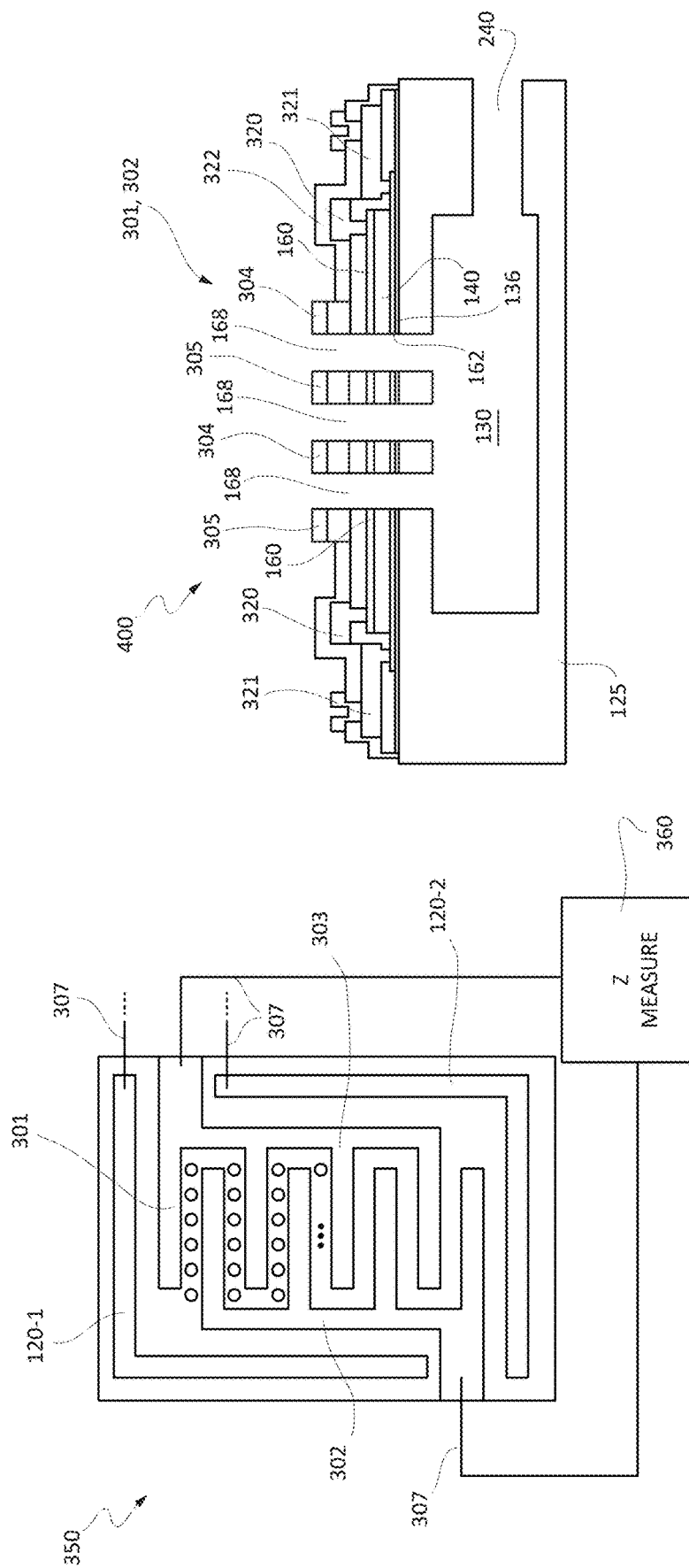

MEMS MICROPARTICLE SENSOR

BACKGROUND

Technical Field

The present disclosure relates to the field of the Micro Electro Mechanical Systems (hereinafter referred to as "MEMS"). One of more embodiments of the present disclosure relates to a MEMS device for sensing microparticles.

Description of the Related Art

Several applications provide for the ability to sense microparticles. For example, a device able to sense particulate matter suspended in air can be expediently employed in order to monitor the pollution level of an environment.

Among the available sensing devices capable to sense microparticles, such as particulate matter, sensing devices implemented by MEMS (Micro-Electro-Mechanical System) devices are known.

Generally, a MEMS device is a device comprising miniaturized mechanical, electrical and/or electronic components integrated in a same semiconductor material substrate, for example silicon, by means of micromachining techniques (for example, lithography, deposition, etching, deposition, growth).

Known MEMS devices for sensing microparticles (hereinafter also referred to as "MEMS microparticles sensing device" or simply "MEMS sensing device" for the sake of conciseness) have one or more cantilevered members excited in resonance by driving elements comprising mechanical piezoceramic, electrostatic, piezoelectric and electro-thermal components. A sticking coating is provided on one or more sensing surfaces of the cantilevered member in order to capture microparticles. The microparticles stuck on the sticking coating cause a resonance variation depending on the amount of microparticles.

BRIEF SUMMARY

The Applicant has found that known MEMS microparticles sensing devices are not efficient due to one or more of the following drawbacks.

Known MEMS microparticles sensing devices are provided with a sticking coating for capturing microparticles, and after each use, need to be subjected to a cleaning operation directed to the removal of the sticking coating together with the microparticles stuck thereon followed by the application of a new sticking coating in order reset the MEMS sensing device to its original condition.

Therefore, the known MEMS microparticles sensing devices are not suited for those applications in which frequent sensing operations have to be performed. Moreover, since the cleaning operation may require the use of specific instrumentations and/or substances for the removal of the old sticking coating and the application of a new sticking coating, the known MEMS microparticles sensing devices are also not particularly suited for the "on the field" applications.

In view of the above, an aim of the present disclosure is to provide a MEMS microparticles sensing device which is not affected by the abovementioned drawbacks.

According to the disclosure, a MEMS sensing device for sensing microparticles in an environment external to the MEMS sensing device and a method are provided, according to the attached claims.

BRIEF DESCRIPTION OF THE SEVERAL VIEWS OF THE DRAWINGS

The features and advantages of the present disclosure will be better understood from following detailed description of embodiments thereof, provided merely by way of non-limitative examples, to be read in conjunction with the attached drawings. In this regard, it is explicitly intended that the drawings are not necessarily drawn to scale (with some details thereof that may be exaggerated and/or simplified) and that, unless otherwise stated, they are simply used for conceptually illustrating the described structures and processes.

FIGS. 1A and 1B illustrated a (portion of a) sensor of a MEMS microparticles sensing device according to an embodiment of the present disclosure;

FIGS. 2A and 2B illustrate a simplified view of a MEMS microparticles sensing device according to an embodiment of the present disclosure, during a sensing phase and during a cleaning phase;

FIGS. 3A-3C illustrates further version of the MEMS sensing microparticles device according to embodiments of the disclosure;

FIGS. 4A-4H illustrates steps of a process for manufacturing a MEMS microparticles sensing device according to an embodiment of the disclosure;

FIGS. 5A-5D illustrates steps of a process for manufacturing a MEMS microparticles sensing device according to another embodiment of the disclosure;

FIG. 8 is a schematic view of a system including a further embodiment of the MEMS microparticles sensing device;

FIG. 9 is a cross section of another embodiment of the MEMS microparticles sensing device.

DETAILED DESCRIPTION

Figure 6:
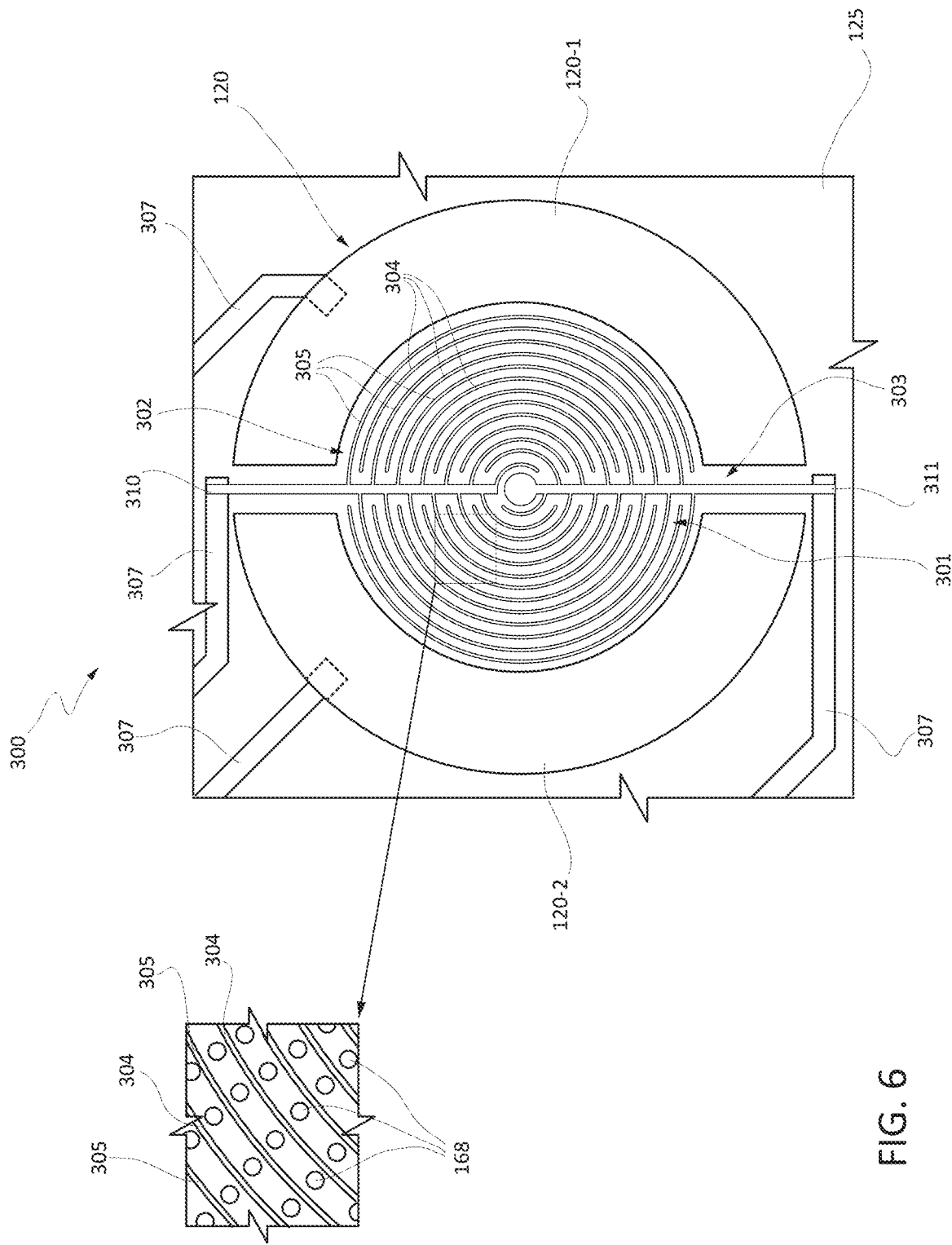
FIG. 6 is a top plan view of a different embodiment of the MEMS microparticles sensing device.

FIG. 1A is a view from above and FIG. 1B is a section view of a portion of a sensor 100 of a MEMS microparticles sensing device (hereinafter, simply "MEMS sensing device") according to an embodiment of the present disclosure.

In the following of the present description, direction terminology (such as for example, top, bottom, higher, lower, lateral, central longitudinal, transversal, vertical) will be only used for describing the sensor 100 as well as other elements of the MEMS sensing device which will be described in the following in relation to the very specific orientation illustrated in the figures, and not for describing possible specific orientation these elements will have during their operation.

On this regard, a reference direction system is shown including three orthogonal directions X, Y, Z.

The sensor 100 comprises a membrane 110 mechanically coupled with a piezoelectric element 120 configured to be actuated through electric signals for causing flexural motion thereof. When the piezoelectric element 120 is actuated, the membrane 110 oscillates about its equilibrium position at a corresponding resonance frequency fr.

The resonance frequency fr depends on several factors, such as the size, shape, material and mass of the membrane 110. When microparticles are located on or above the membrane 110, the resulting mass of the membrane 110 increases, causing a corresponding variation in the resonance frequency fr. A relationship is thus established between the mass/amount of microparticles on the membrane 110 and the variation in the resonance frequency fr (generally, the higher the mass/amount of microparticles, the lower the resonance frequency). This relationship is advantageously exploited by the MEMS sensing device comprising the sensor 100 for sensing microparticles in an environment wherein the MEMS sensing device is located. The MEMS sensing device comprising the sensor 100 is configured to sense (e.g., assess the mass/amount of) microparticles according to the resonance frequency fr.

According to an exemplary embodiment, the sensor 100 has a resonance frequency fr that is of the order of hundreds of kHz or MHz. For example, the resonance frequency fr of the sensor 100 in absence of microparticles on the membrane 110 is about 500 kHz.

Here, the sensor 100 has an architecture based on the architecture of a Piezoelectric Micromachined Ultrasonic Transducer device ("PMUT device")

The sensor 100 may have a circular (or substantially circular) shape (along a plane parallel to directions Y and Z). In the alternative, the sensor 100 may have different shapes, such as a square (or substantially square) shape, a rectangular (or substantially rectangular) shape, a triangular (or substantially triangular) shape, hexagonal (or substantially hexagonal) shape, or an octagonal (or substantially octagonal) shape.

The sensor 100 is formed in a body 125 of semiconductor material, hereinafter referred to as semiconductor substrate 125. Semiconductor substrate 125 may integrate other components useful for the sensor 100. The semiconductor substrate 125 may be a monocrystalline silicon substrate, hereinafter simply referred to as silicon substrate 125. The silicon substrate 110 of the PMUT device 100 illustrated in FIGS. 1A and 1B has a front operative surface 127 extending parallel to plane YZ.

In FIG. 1B, the silicon substrate 125 comprises a sensor substrate cavity 130 (only a portion thereof illustrated in FIG. 1B) defining a hollow space delimited by lateral walls extending substantially along planes XZ and YZ, a bottom wall extending substantially along plane YZ, and a top wall extending substantially along plane YZ. However the lateral, bottom and/or top walls of the cavity 130 may be slanted.

The membrane 110 has a top surface 132 and a bottom surface 134, extending, at rest, substantially parallel to plane YZ.

According to an embodiment, the membrane 110 has a circular (or substantially circular) shape (along a plane parallel to plane YZ); however, the membrane 110 may have different shapes, such as a square (or substantially square) shape, a rectangular (or substantially rectangular) shape, a triangular (or substantially triangular) shape, hexagonal (or substantially hexagonal) shape, or an octagonal (or substantially octagonal) shape.

The membrane 110 is suspended above the sensor substrate cavity 130.

The bottom surface 134 of the membrane 110 corresponds to a portion of the top surface of the hollow space defined by the sensor substrate cavity 130.

In FIG. 1B, the top surface 132 of the membrane 110 is flush with the front operative surface 127 of the silicon substrate 125.

In FIGS. 1A and 1B, the membrane 110 is made of the same material of the silicon substrate 125, i.e., silicon, particularly monocrystalline silicon.

Optionally, the membrane 110 comprises one or more membrane cavities 135 for increasing the elasticity of the membrane 110.

The piezoelectric element 120 is located above the top surface 132 of the membrane 110. In FIGS. 1A and 1B, an electric insulating layer 136 is provided between the top surface 132 of the membrane 110 and the piezoelectric element 120. The electric insulating layer 136 may comprise an electric insulating material, such as silicon dioxide.

The piezoelectric element 120 is configured to:
cause the membrane 110 to oscillate when electric signals are applied across the piezoelectric element 120, and
generate electric signals in response to oscillations of the membrane 110.

In fact, microparticles deposited onto the membrane 110 cause a change in the mass of the membrane 110 and, thus, of the oscillation frequency. Therefore, the electric signals generated by the sensor 100 also undergo a change in frequency and this frequency change may be used to detect the mass of the deposited microparticles.

In FIGS. 1A and 1B, the piezoelectric element 120 has a circular (or substantially circular) shape (along a plane parallel to plane YZ); however, the piezoelectric element 120 may have different shapes, such as a square (or substantially square) shape, a rectangular (or substantially rectangular) shape, a triangular (or substantially triangular) shape, hexagonal (or substantially hexagonal) shape, or an octagonal (or substantially octagonal) shape.

In FIGS. 1A and 1B, the piezoelectric element 120 comprises a piezoelectric material layer 140, e.g., comprising aluminum nitride or PZT, between a top conductive layer 160 (above piezoelectric material layer 140) and a bottom conductive layer 162 (below piezoelectric material layer 140). For example, each of the top and the bottom conductive layers 160, 162 comprises titanium-tungsten and/or platinum; and, according to an exemplary preferred embodiment of the piezoelectric material layer 140 comprises PZT and the top and the bottom conductive layers 160, 162 comprises platinum.

The top conductive layer 160 and the bottom conductive layer 162 (or at least portions thereof) form electrodes of the piezoelectric element 120 across which it is possible to:
apply electric signals to the piezoelectric material layer 140 for causing oscillations of the membrane 110, and
collect electric signals generated by the piezoelectric material layer 140 in response to oscillations of the membrane 110.

The piezoelectric element 120 comprises a piezoelectric element opening 165 that uncovers a corresponding portion 166 of the underlying membrane 110. In FIGS. 1A and 1B, the piezoelectric element opening 165 is located at a central portion of the piezoelectric element 120 so that the corresponding portion 166 of the underlying membrane 110 not covered by the piezoelectric element 120 is at least substantially located at the center of the membrane 110.

In FIGS. 1A and 1B, the membrane 110 comprises, at the central portion 166, a set of through holes 168 crossing the entire thickness of the membrane 110 (along direction Z) from the top surface 132 to the bottom surface 134. In this way, fluid communication is established between the sensor substrate cavity 130 and the external environment through the membrane 110. For example, the through holes 168 are located close to each other so that the central portion 166 of the membrane 110 defines a sieve-like structure.

According to an alternative (not illustrated in the figures), no piezoelectric element opening 165 is provided, and the through holes 168 extend through a (e.g., central) portion of the piezoelectric element 120. In this case, the through holes 168 extends across the thickness of the piezoelectric element 120 and the thickness of the membrane 110.

In FIG. 1B, the piezoelectric element 120 and the parts of the central portion 166 of the membrane 110 between adjacent through holes 168 are covered with a passivation layer 170, for example comprising Undoped Silicate Glass (USG) or Silicon Nitride.

As will be described in detail hereinafter, the through holes 168 of the membrane 110 of the sensor 100 are configured to:
   cause microparticles to adhere onto the membrane 110 by a suction force when the air pressure inside the sensor substrate cavity 130 is reduced with respect to the environmental air pressure outside the sensor substrate cavity 130 (sensing phase);
   cause microparticles to be blown away from the membrane 110 by a blowing force when the air pressure inside the sensor substrate cavity 130 is increased with respect to the environmental air pressure outside the sensor substrate cavity 130 (cleaning phase).

In this way, during a sensing phase, the microparticles advantageously adhere against the membrane 110, allowing an improved microparticles sensing, and, during the cleaning phase, the microparticles located on the membrane 110 are advantageously blown away, allowing an improved cleaning of the membrane 110.

The diameter of the through holes 168 may be properly set according to the size of the microparticles to be sensed; for example, the diameter of the through holes may be set to correspond to the average diameter of the microparticles to be sensed; in the alternative, the diameter of the through holes may be set to correspond to a value lower than the average diameter of the microparticles to be sensed. For example, if the microparticles to be sensed are Particulate Matter (PM), the diameter of the through holes 168 may be advantageously set to 1 μm (for sensing $PM_{2.5}$ particulate matter), 2 μm (for sensing $PM_5$ particulate matter), or 4 μm (for sensing $PM_{10}$ particulate matter).

As will be described in detail hereinafter, the air pressure inside the sensor substrate cavity 130 of the sensor 100 is controlled by feeding/drawing up air to/from the sensor substrate cavity 130 through one or more pumps configured to:
   draw air from the sensor cavity 130 and expel it into the external environment through a pump port different from the through holes 168 during the first sensing phase;
   feed air coming from the external environment through the pump port into the sensor cavity 130 during the cleaning phase.

In FIG. 1B, the top conductive layer 160 comprises a first top plate 160(1) and a second top plate 160(2) that are electrically insulated one to another, and can apply/receive independent electric signals, for example by means of two separated and dedicated electrode pads P(1), P(2) (visible in FIG. 1A).

In addition, in FIG. 1B, the bottom conductive layer 162 comprises a first bottom plate 162(1) and a second bottom plate 162(2) that are electrically insulated one to another, and can apply/receive independent electric signals, for example by means of two separated and dedicated electrode pads B(1), B(2) (visible in FIG. 1A).

The first top plate 160(1) and the second top plate 160(2) are concentric, with the second top plate 160(2) surrounding the first top plate 160(1). Similarly, the first bottom plate 162(1) and the second bottom plate 162(2) are concentric, with the second bottom plate 162(2) surrounding the first bottom plate 162(1). Since each of the top conductive layer 160 and bottom conductive layer 162 comprises two concentric plates that are electrically insulated to each other and that can be driven independently, advantageously it is possible to selectively modify the shape (and particularly the concavity) of the membrane 110 during the sensing and cleaning phase in order to favor the adhesion/removal of microparticles to/from the membrane 110.

Particularly:
   during the sensing phase, the second top plate 160(2) and the second bottom plate 162(2) are employed as sensing plates for applying/collecting electric signals to/from the piezoelectric material layer 140, while the first top plate 160(1) and the first bottom plate 162(1) are biased to have a mutual voltage difference 4 V having a value such to cause the membrane 110 to have a concave shape directed upwardly so as to favor the adhesion of microparticles to the membrane 110;
   during the cleaning phase, the second top plate 160(2) and the second bottom plate 162(2) are biased to have a mutual voltage difference ΔV having a value such to cause the membrane 110 to have a concave shape directed upwardly so as to disfavor the adhesion of microparticles to the membrane 110.

In the alternative, the first top plate 160(1) may be employed as a sensing plate, while the second top plate 160(2) may be biased to change the concavity of the membrane 110.

According to another embodiment not illustrated in the figures, in order to cause a change in the concavity of the membrane 110, the piezoelectric material layer 140 advantageously comprises two separated and independent portions of piezoelectric material.

In the alternative, the top conductive layer 160 may be a single plate, and the concavity of the membrane 110 may be not substantially modified during the sensing and cleaning phases (in this case, the adhesion/removal of microparticles to/from the membrane 110 is only caused by the suction/blowing force caused by the air pressure of the sensor substrate cavity 130).

According to another (not illustrated) embodiment, only one between the top conductive layer 160 and the bottom conductive layer 162 comprises two concentric bottom plates that are electrically insulated one to another, and that can be driven independently, while the other one is made of a single plate (in this case, the conductive layer made of a single plate is configured to operate as a sensing plate for applying/collecting electric signals to/from the piezoelectric material layer 140).

In FIGS. 1A and 1B, in order to reduce the possibility that microparticles remain stuck on the membrane 110 during the cleaning phase, a non-stick coating layer 190 is provided on the passivation layer 170. For instance, the non-stick coating layer 190 comprises a hydrophobic material, such as for example FAS-17.

FIGS. 2A and 2B illustrate a simplified (i.e., without depicting some elements thereof, such as the piezoelectric element, for the sake of simplicity) section view of a MEMS microparticles sensing device 200 during the sensing phase (FIG. 2A) and during the cleaning phase (FIG. 2B).

MEMS sensing device 200 of FIGS. 2A and 2B comprises the sensor 100 already described with reference to FIGS. 1A and 1B and a pump 205 configured to control the air pressure inside the sensor substrate cavity 130 of the sensor 100.

The pump 205 is a MEMS pump device. For example, the pump 205 is a valveless micropump. In FIGS. 2A and 2B, the pump 205 is a piezoelectric valveless micropump comprising a pump membrane 210 mechanically coupled with a piezoelectric element (not illustrated in the figure) configured to be actuated through electric signals for causing flexural motion of the pump membrane 210. The pump membrane 210 forms a top wall of a pump substrate cavity 230.

In FIGS. 2A and 2B, the pump substrate cavity 230 is in fluid communication with the sensor substrate cavity 130 of the sensor 100 through a first duct 240(1) and is in fluid communication with the external environment through a second duct 240(2).

During the sensing phase (see FIG. 2A), the pump 205 is controlled in order to draw air from the sensor substrate cavity 130 through the first duct 240(1) and expel said air into the external environment through the second duct 240(2). In this way, the air pressure inside the sensor substrate cavity 130 is reduced with respect to the environmental air pressure outside the sensor substrate cavity 130. This reduced pressure causes in turn microparticles (identified in FIGS. 2A and 2B with reference 245) suspended in the external environment to be attracted against the membrane 110 by a suction force through the through holes 168 of the membrane 110. In this way, the mass increment caused by the attracted microparticles 245 can be efficiently assessed in a stable way by the sensor 100 without requiring a dedicated sticking coating.

During the cleaning phase (see FIG. 2B), the pump 205 is controlled in order to feed air coming from the external environment through the second duct 240(2) into the sensor substrate cavity 130 through the first duct 240(1). In this way, the air pressure inside the sensor substrate cavity 130 is increased with respect to the environmental air pressure outside the sensor substrate cavity 130. This increased pressure causes in turn microparticles 245 attached against the membrane 110 to be removed from the membrane 110 by a blowing force through the through holes 168 of the membrane 110. In this way, the microparticles 245 can be efficiently removed from the membrane and the sensor 110 can be reset to its original condition to allow subsequent sensing phases being efficiently carried out without being forced to perform long, complicated and cumbersome operations for removing sticking coatings followed by the application of new sticking coatings.

In particular, the pump 205 is controlled to draw air from the sensor substrate cavity 130 through the first duct 240(1) and expel air into the external environment through the second duct 240(2) during the sensing phase by causing the pump membrane 210 to have a concave shape directed downwardly In this case, the pump 205 is controlled to feed air coming from the external environment through the second duct 240(2) into the sensor substrate cavity 130 through the first duct 240(1) during the cleaning phase by causing the pump membrane 210 to have a concave shape directed upwardly.

Selective direction of air in the sensing and cleaning phases may be obtained by variable section ducts 240(1) and 240(2), as discussed hereinbelow. In the alternative, other solution may be devised for generating the desired flow direction of air.

FIG. 3A is a top view of a MEMS sensing device 200 with variable section ducts 240(1) and 240(2). Here, the geometry is such as to favor passage of flow from the from the sensor substrate cavity 130 to the external environment.

In particular, here, the first duct 240(1) and the second duct 240(2) have a tapered shape, in such a way that, during the operation of the pump 205, the air flow from the pump 205 to the sensor 100 is lower than the air flow from the sensor 100 to the pump 205, i.e., when the pump 205 is activated, the net air flow is directed from the sensor substrate cavity 130 to the external environment. Particularly, in FIG. 3A, the first duct 240(1) has a section area (parallel to plane XZ) that increases by moving from the sensor substrate cavity 130 to the pump cavity 230, and the second duct 240(2) has a section area (parallel to plane XZ) that increases by moving from the pump cavity 230 to the outside of the pump 205.

FIG. 3B is a top view of a MEMS sensing device—identified with reference 200"—according to a further embodiment of the present disclosure. The elements of the MEMS sensing device 200" corresponding to the elements of the MEMS sensing device 200 will be identified using the same references used in the previous figures, and their description will be omitted for the sake of brevity. In FIG. 3B, two pumps are provided, identified with references 205(1) and 205(2). Pump 205(1) is in fluid communication with the sensor substrate cavity 130 of the sensor 100 through a duct 240(1,1) and with the external environment through a duct 240(1,2). Pump 205(2) is in fluid communication with the sensor substrate cavity 130 of the sensor 100 through a duct 240(2,1) and with the external environment through a duct 240(2,2).

Here, the duct 240(1,1) and the duct 240(1,2) have a tapered shape, in such a way that, during the operation of the pump 205(1), the air flow from the pump 205(1) to the sensor 100 is lower than the air flow from the sensor 100 to the pump 205(1), i.e., when the pump 205(1) is activated, the net air flow is directed from the sensor 100 to the external environment.

Furthermore, the duct 240(2,1) and the duct 240(2,2) have a tapered shape in such a way that, during the operation of the pump 205(2), the air flow from the pump 205(2) to the sensor 100 is higher than the air flow from the sensor 100 to the pump 205(2), i.e., when the pump 205(2) is activated, the net air flow is directed from to the external environment to the sensor 100. Particularly, here, the duct 240(1,1) has a section area (parallel to plane XZ) that increases by moving from the sensor 100 to the pump 205(1), and the duct 240(1,2) has a section area (parallel to plane XZ) that increases by moving from the pump 205(1) to the outside of the pump 205, while the duct 240(2,1) has a section area (parallel to plane XZ) that decreases by moving from the sensor 100 to the pump 205(2), and the duct 240(2,2) has a section area (parallel to plane X Z) that decreases by moving from the pump 205(2) to the outside of the pump 205(2).

Accordingly, during the sensing phase, the pump 205(1) is activated and the pump 205(2) is deactivated, and during the cleaning phase, the pump 205(1) is deactivated and the pump 205(2) is activated.

FIG. 3C is a top view of a MEMS sensing device 200''' that is a modified version of the MEMS sensing device 200" illustrated in FIG. 3B In FIG. 3C, the pump 205(1) is replaced by a pair of pumps 205(1)(a), 205(1)(b) fluidly connected in parallel to each other and configured to be operated in antiphase and the pump 205(2) is replaced by a pair of pumps 205(2)(a), 205(2)(b) fluidly connected in parallel to each other and configured to be operated in antiphase. In this way, by activating the pumps 205(1)(a), 205(1)(b) during the sensing phase with a mutual phase shift of 180° and by activating the pumps 205(2)(a), 205(2)(b) during the cleaning phase with a mutual phase shift of 180°, undesired pulsating air flows are advantageously reduced.

Analogously, the present MEMS sensing device may include the combination of one or more sensors with one or more (single or pairs of) pump properly connected and operated during the sensing and cleaning phases.

FIGS. 4A-4H illustrate main steps of a process for manufacturing a MEMS sensing device. The manufacturing process illustrated in the FIGS. 4A-4H can be used for manufacturing the MEMS sensing device comprising a single sensor 100 and a single pump 205 as the MEMS sensing device 200 of FIGS. 2A-2B or the MEMS sensing device 205' of FIG. 3A. The same manufacturing process can be directly employed also to manufacture other MEMS sensing devices, such as the ones illustrated in FIGS. 3B and 3C.

By making reference to FIG. 4A, the sensor 100 and the pump 205 are manufactured starting from a same semiconductor substrate 125, e.g., of silicon.

Then the sensor substrate cavity 130 for the sensor 100, the pump cavity 230 for the pump 205 and the duct 240(1) between the two cavities (see FIGS. 2A-2B) are formed in semiconductor substrate 125.

The substrate cavity 130, the pump cavity 230 and the duct 240(1) may be manufactured based on the method disclosed in the U.S. Pat. No. 7,294,536 and in the patent application US 2008/261345 (filed by the same Applicant). Briefly, lithographic masks are used having a honeycomb lattice. Then, using said masks, trench etching of the silicon substrate is performed to form corresponding silicon columns. After the removal of the lithographic masks, epitaxial growth is performed in a deoxidizing environment (e.g., in an atmosphere with a high concentration of hydrogen, preferably using $SiHCl_3$), so that an epitaxial layer grows on top of the silicon columns, trapping gas ($H_2$) present therein. An annealing step is then carried out, causing a migration of the silicon atoms, which tend to arrange themselves in lower energy positions. Consequently, the silicon atoms of the silicon columns migrate completely, forming the sensor substrate cavity 130, the pump cavity 230 and the duct 240(1).

The portion of the semiconductor substrate 125 directly over the sensor substrate cavity 130 forms the membrane 110, and the portion of the semiconductor substrate 125 directly over the pump cavity 230 forms the pump membrane 210.

In FIG. 4C, membrane cavities 135 are formed in the membrane 110 and in the pump membrane 210 for increasing the elasticity thereof. The membrane cavities 135 may be formed using the abovementioned method disclosed in the U.S. Pat. No. 7,294,536 and in the patent application US 2008/261345. However, the membrane cavities 135 are optional.

In FIG. 4D, an electric insulating layer 136, e.g., of oxide is deposited on the front operative surface 127 of the semiconductor substrate 125, for example by means of a Low pressure Chemical Vapor Deposition (LPCVD using tetraethyl orthosilicate as precursor), and a stack 402 is deposited on the electric insulating layer 136. The stack 402 comprises a layer of piezoelectric material, e.g., comprising aluminum nitride or PZT, between two conductive layers, for example a TiW layer and/or a platinum layer.

In FIG. 4E, the stack 402 is patterned so as to form:
the piezoelectric element 120 aligned with the sensor substrate cavity 130, obtaining the layers 160, 162, 140 (see FIG. 1A);
the piezoelectric element opening 165 (see FIG. 1A), and a further piezoelectric element 410 aligned with the pump cavity 230, for the actuation of the pump membrane 210.

The piezoelectric element 120 is also patterned to obtain the first top plate 160(1) and the second top plate 160(2) from the top conductive layer 160. In the alternative, the piezoelectric element 120 may be patterned so that the top conductive layer 160 is made of a single plate (i.e., the first top plate 160(1) and the second top plate 160(2) are not formed). In addition, also the piezoelectric element 120 is patterned to separate the bottom conductive layer 162 in two plates.

In FIG. 4F, the passivation layer 170 (for example USG or Silicon Nitride) is deposited.

In FIG. 4G, the through holes 168 are formed at the piezoelectric opening 165 by performing a selective etching operation.

Then, the non-stick coating layer 190 (e.g., a hydrophobic material, such as for example FAS-17) is deposited on the passivation layer 170.

FIGS. 5A-5D illustrate steps of another process for manufacturing a MEMS sensing device.

In FIG. 5A, the sensor 100 and the pump 205 are manufactured starting from a same semiconductor substrate 125, e.g., of silicon.

Then, FIG. 5B, a recess 505 is formed in the semiconductor substrate 125 by means of an etching process. The recess 505 is patterned so as to correspond to the sensor substrate cavity 130 for the sensor 100, the pump cavity 230 for the pump 205 and the duct 240(1) between the two cavities (see FIGS. 2A-2B).

In FIG. 5C, a Silicon-On-Insulator (SOI) substrate 506 comprising an active layer (also called device layer 512), a buried oxide layer (also called box layer 514), and a support layer (also called handle layer 516) is turned upside-down (i.e., with the handle layer 516 on the top) and bonded to the semiconductor substrate 125 to upwardly close the recess 505. In this way, the sensor substrate cavity 130 for the sensor 100, the pump cavity 230 for the pump 205 and the duct 240(1) are thus formed (see FIGS. 2A-2B).

In FIG. 5D, the handle layer 516 is removed, for example by means of a mechanical polishing process, until exposing the box layer 514, so as to define the membrane 110 and the pump membrane 210 from the device layer 512, and the electric insulating layer 136 from the box layer 514.

Then, the manufacturing process proceeds in the same way as already described with reference to FIGS. 4D-4H. It is pointed out that, according to this embodiment, the membrane cavities 135 are not formed.

Figure 7:
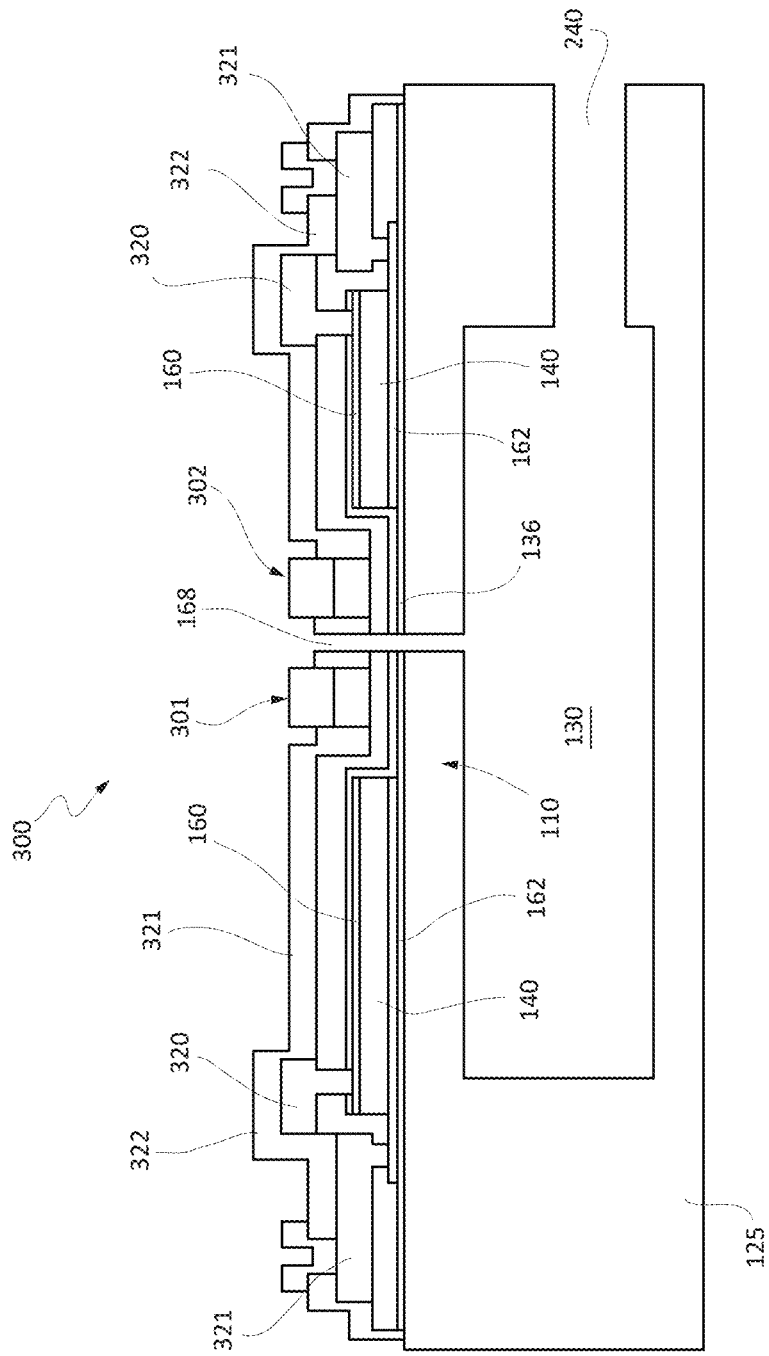
FIG. 7 is a cross section of the MEMS microparticles sensing device of FIG. 6.

FIGS. 6 and 7 show a portion of a MEMS sensing device 300 having, in addition to the piezoelectric element 120, an impedance measuring structure 301. In particular, the impedance measuring structure 301 includes interdigitated sensing electrodes.

Generally, MEMS sensing device 300 has an overall structure similar to sensing devices 200, 200', 200", 200'''; thus, similar parts are indicated by the same reference numbers and are not described.

The piezoelectric element 120 and the impedance measuring structure 301 extend on the semiconductor substrate 125; the piezoelectric element 120 has here an annular shape and surrounds the impedance measuring structure 301. In particular, top conductive layer 160, bottom conductive layer 162 and piezoelectric material layer 140 are all annular shaped.

Impedance measuring structure 301 comprises a first impedance measuring electrode 302 and a second measuring electrode 303. In MEMS sensing device 300, impedance measuring electrodes 302 and 303 are interdigitated and ring-shaped.

Impedance measuring electrodes 302 and 303 are of conductive material. For example, impedance measuring electrodes 302 and 303 are of gold.

In particular, the first impedance measuring electrode 302 of FIG. 6 include a plurality of first electrode portions 304 and the second impedance measuring electrode 303 includes a plurality of second top electrode portions 305. First and second electrode portions 304 and 305 are interdigitated and electrically isolated from each other.

First electrode portions 304 are half-ring shaped and are electrically coupled to each other and to a first connecting portion 310.

Second electrode portions 305 are also half-ring shaped and are electrically coupled to each other and to a second connecting portion 311.

Piezoelectric element 120 here is ring-shaped and formed by two portions 120-1 and 120-2 that may be electrically coupled to form an electrically single top electrode 160 and an electrically single bottom electrode 162 (FIG. 7). First and second connecting portions 310 and 311 extend between the portions 120-1, 120-2 of the piezoelectric element 120 and are insulated therefrom.

Electrical lines 307 are connected to the first and second connecting portions 310, 311 of the impedance measuring structure 301 and to the piezoelectric element 120.

Through holes 168 extend also here across the entire thickness of the membrane 110, between the first and the second electrode portions 304, 305, as shown in the enlarged detail of FIG. 6 (only one shown for sake of simplicity).

FIG. 7 also shows top electrode contact portions 320 in direct electrical contact with the top conductive layer 160 through openings in the passivation layer 170 and bottom contact portions 321 in direct electrical contact with the bottom conductive layer 162; and a further passivation layer 322 covering the entire structure.

MEMS sensing device 300 of FIGS. 6 and 7 operate in a way that is similar to the MEMS sensing devices 200, 200', 200", but are also able to perform some measures about the nature of the particles.

In particular, in the sensing phase, microparticles adhering against the membrane 110 change the impendence of the MEMS sensing device 300, so that a processor coupled to first and second connecting portions 310, 311 and receiving an electrical signal generated by the impedance measuring structure 301 may detect the nature (metal/dielectric) nature of the microparticles.

In a cleaning phase, the MEMS sensing device 300 operates as discussed above.

FIG. 8 shows a different MEMS sensing device, identified by reference number 350.

MEMS sensing device 350 has also an impedance measuring structure 301 including interdigitated electrodes, but here the interdigitated electrodes (also called here impedance measuring electrodes 302 and 303) are comb-like shaped.

FIG. 8 also shows an electronic processor 360 for impedance measurement.

MEMS sensing device 350 operates as above indicated for MEMS sensing device 300.

FIG. 9 shows a portion of a MEMS sensing device 400 having the piezoelectric element 120 and the impedance measuring structure 301. The impedance measuring structure 301 includes interdigitated sensing electrodes.

Here, piezoelectric element 120 is circle or disk shaped and extends below the impedance measuring structure 301. Specifically, the piezoelectric element 120 has a larger diameter than the impedance measuring structure 301.

The MEMS sensing devices 300, 350 and 400 of FIGS. 6-9 may be manufactured in a similar way as described with reference to FIGS. 4A-4H or FIGS. 5A-5D with different mask to form the impedance measuring structure 301. In particular, first and second electrode portions 304 and 305 are formed from a same layer used to form top and bottom contact portions 320, 321 of the piezoelectric element 120.

Figure 10:
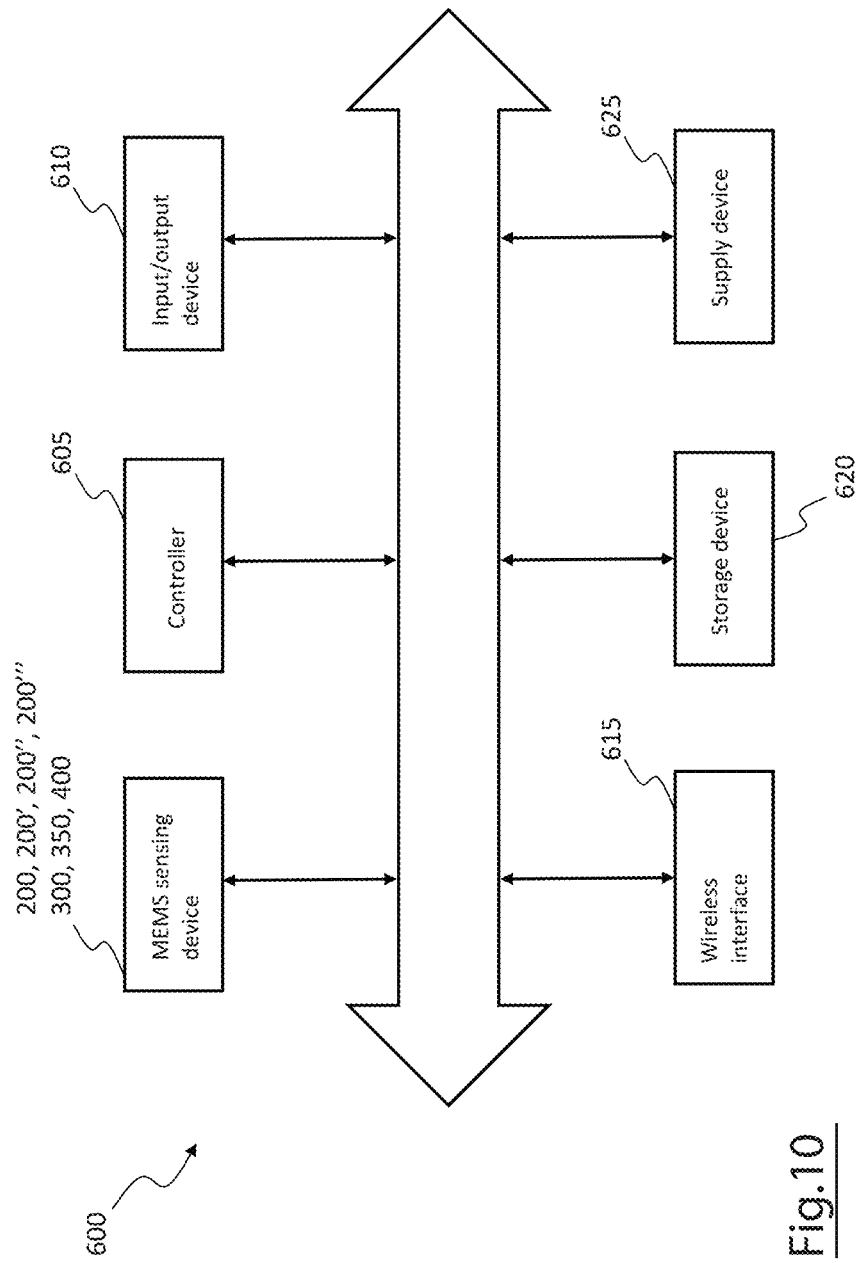
FIG. 10 illustrates in terms of simplified blocks an electronic system comprising at least one MEMS microparticles sensing device according to the embodiments of the disclosure.

FIG. 10 illustrates a block diagram of an electronic system 600 comprising at least one of the MEMS sensing devices 200, 200', 200", 200''', 300 or 400.

The electronic system 600 is adapted to be used in electronic devices such as for example personal digital assistants, computers, tablets, and smartphones.

The electronic system 600 may comprise, in addition to the MEMS sensing device 200, 200', 200", 200''', a controller 605, such as for example one or more microprocessors and/or one or more microcontrollers, an input/output device 610 (such as for example a keyboard, and/or a touch screen and/or a visual display) for generating/receiving messages/commands/data, and/or for receiving/sending digital and/or analogic signals; a wireless interface 615 for exchanging messages with a wireless communication network (not shown), for example through radiofrequency signals. Examples of wireless interface 615 may comprise antennas and wireless transceivers; a storage device 620, such as for example a volatile and/or a non-volatile memory device; a supply device 625, for example a battery, for supplying electric power to the electronic system 600; and one or more communication channels (buses) for allowing data exchange between the MEMS sensing device 200, 200', 200", 200''', 300, 400 and the controller 605, and/or the input/output device 610, and/or the wireless interface 615, and/or the storage device 620, and/or the battery 625, when they are present.

Finally, it is clear that numerous variations and modifications may be made to the described and illustrated herein, all falling within the scope of the disclosure as defined in the attached claims.

For example, the various embodiments described above can be combined to provide further embodiments.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS (microelectromechanical sensor) sensing device for sensing microparticles in an environment external to the MEMS sensing device, the MEMS sensing device comprising:
   a semiconductor body integrating a sensor and a pump;
      wherein the sensor includes a sensor cavity, a membrane suspended over the sensor cavity, and a piezoelectric element located over the membrane and configured to cause the membrane to oscillate about an equilibrium position and at a resonance frequency when sensing electric signals are applied to the piezoelectric element during a first operative phase of the MEMS sensing device, the resonance frequency depending on an amount of microparticles located on the membrane;
wherein the membrane includes a plurality of through holes configured to establish a fluid communication between the sensor cavity and the environment; and
wherein the pump is adjacent to the sensor, connected to the sensor through a duct extending in the semiconductor body, and configured to cause air pressure in the sensor cavity to be reduced with respect to the air pressure of the environment during the first operative phase such that microparticles are caused to adhere onto the membrane by a suction force through the plurality of through holes.

2. The MEMS sensing device of claim 1, wherein the pump is configured to cause air pressure in the sensor cavity to be increased with respect to the air pressure of the environment during a second operative phase such that microparticles are caused to be blown away from the membrane by a blowing force through the plurality of through holes.

3. The MEMS sensing device of claim 1, wherein the piezoelectric element comprises a piezoelectric material layer between a top conductive layer and a bottom conductive layer, at least a portion of the top conductive layer and the bottom conductive layer forming electrodes for receiving the sensing electric signals.

4. The MEMS sensing device of claim 3, wherein the plurality of through holes are located at a central portion of the piezoelectric material layer.

5. The MEMS sensing device of claim 3, wherein the piezoelectric element comprises a piezoelectric element opening at a central portion of the membrane, wherein the plurality of through holes are located at the central portion of the membrane.

6. The MEMS sensing device of claim 5, further comprising a non-stick coating layer covering the piezoelectric element and the central portion of the membrane.

7. The MEMS sensing device of claim 6, wherein the non-stick coating layer comprises a hydrophobic material.

8. The MEMS sensing device of claim 5, wherein the top conductive layer comprises a first top plate surrounding the central portion of the membrane and a second top plate surrounding the first top plate, the first and second top plates being electrically insulated from each other, and the bottom conductive layer comprises a first bottom plate surrounding the central portion of the membrane and a second bottom plate surrounding the first bottom plate, the first and second bottom plates being electrically insulated from each other,
wherein the second top plate and the second bottom plate are configured to receive the sensing electric signals during the first operative phase,
wherein the first top plate and the first bottom plate are configured to be biased during the first operative phase so that a voltage difference develops across the first top plate and the first bottom plate having a value that causes the membrane to have a concave upwards shape, and
wherein the second top plate and the second bottom plate are configured to be biased during the second operative phase so that a voltage difference develops across the second top plate and the second bottom plate having a value that causes the membrane to have a concave downward shape.

9. The MEMS sensing device of claim 1, further comprising an impedance measuring structure on the membrane and above the sensor cavity.

10. The MEMS sensing device of claim 9, wherein the impedance measuring structure comprises a plurality of first electrode portions and a plurality of second electrode portions, the plurality of first electrode portions being electrically isolated from the second plurality of electrode portions and interdigitated.

11. The MEMS sensing device of claim 9, wherein the impedance measuring structure is surrounded by the piezoelectric element or is arranged on a central portion of the piezoelectric element.

12. An electronic system comprising a plurality of MEMS (microelectromechanical sensor) sensing devices, each MEMS sensing device including:
a semiconductor substrate integrating a sensor and a pump,
the sensor including a sensor cavity, a membrane suspended over the sensor cavity, and a piezoelectric element located over the membrane and configured to cause the membrane to oscillate, about an equilibrium position, at a resonance frequency when sensing electric signals are applied to the piezoelectric element during a first operative phase of the MEMS sensing device, said resonance frequency depending on an amount of microparticles located on the membrane;
the membrane including a plurality of through holes that place the sensor cavity in fluid communication with the environment; and
wherein the pump is configured to cause air pressure in the sensor cavity to be reduced with respect to the air pressure of the environment during the first operative phase such that microparticles are caused to adhere onto the membrane by a suction force through the set of through holes.

13. The electronic system of claim 12, wherein the pump of each MEMS sensing device is configured to cause air pressure in the respective sensor cavity to be increased with respect to the air pressure of the environment during a second operative phase such that microparticles are caused to be blown away from the respective membrane by a blowing force through the respective plurality of through holes.

14. The electronic system of claim 12, wherein the respective plurality of through holes are located at a central portion of the respective membrane.

15. The electronic system of claim 14, further comprising a non-stick coating layer covering the piezoelectric element and the central portion of the membrane.

16. The electronic system of claim 12, wherein at least one MEMS sensing device of the plurality of MEMS sensing devices comprises a semiconductor substrate integrating a plurality of pumps, each of the plurality of pumps being in fluid communication with the sensor cavity.

17. The electronic system of claim 16, wherein the plurality of pumps are two or four pumps.

18. A method comprising:
manufacturing a MEMS (microelectromechanical sensor) sensing device for sensing microparticles in an environment external to the MEMS sensing device, the manufacturing including:
integrating at least one sensor and at least one pump in a semiconductor body, the integrating comprising:

forming a sensor cavity in the semiconductor body;
forming a membrane over the sensor cavity, the membrane including a plurality of through holes; and
forming a piezoelectric element over the membrane.

19. The method of claim 18, wherein the plurality of through holes establish fluid communication between the sensor cavity and the environment.

20. The method of claim 18, wherein the pump is configured to cause air pressure in the sensor cavity to be increased with respect to the air pressure of the environment during a second operative phase such that microparticles are caused to be blown away from the membrane by a blowing force through the plurality of through holes.

21. A method for sensing microparticles in an environment external to a MEMS sensing device, the method comprising:

during a first operative phase, applying electric signals to a piezoelectric element of a sensor to cause a membrane of the sensor to oscillate about an equilibrium position and at a resonance frequency, the resonance frequency depending on an amount of microparticles located on the membrane, wherein the sensor is integrated in a semiconductor body and includes a sensor cavity, wherein the membrane is suspended over the sensor cavity, and the piezoelectric element is located over the membrane, wherein the membrane includes a plurality of through holes configured to establish a fluid communication between the sensor cavity and the environment, and using a pump integrated in the semiconductor body to cause air pressure in the sensor cavity to be reduced with respect to the air pressure of the environment during the first operative phase such that the microparticles are caused to adhere to the membrane by a suction force through the plurality of through holes, wherein the pump is adjacent to the sensor and is connected to the sensor through a duct in the semiconductor body.

* * * * *